US008054324B2

(12) United States Patent
Ishiguro

(10) Patent No.: US 8,054,324 B2

(45) Date of Patent: Nov. 8, 2011

(54) OPTICAL HEAD AND IMAGE FORMING APPARATUS

(75) Inventor: Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1116 days.

(21) Appl. No.: 11/626,073

(22) Filed: Jan. 23, 2007

(65) Prior Publication Data

US 2008/0017861 A1 Jan. 24, 2008

(30) Foreign Application Priority Data

Feb. 3, 2006 (JP) ................................ 2006-026593

(51) Int. Cl.

| | |
|---|---|
| ***B41J 2/435*** | (2006.01) |
| ***B41J 2/47*** | (2006.01) |
| ***H01L 23/48*** | (2006.01) |
| ***H01L 23/52*** | (2006.01) |
| ***H01L 29/40*** | (2006.01) |

(52) U.S. Cl. ...................... 347/237; 257/758; 372/38.01

(58) Field of Classification Search .......... 347/234–241, 347/247–251; 257/59, 72, 79; 372/25–29.02, 372/34–36, 38.1, 38.02, 38.07, 50.12
See application file for complete search history.

(56) References Cited

U.S. PATENT DOCUMENTS

| | | | | |
|---|---|---|---|---|
| 4,929,965 | A * | 5/1990 | Fuse | 347/238 |
| 6,919,680 | B2 | 7/2005 | Shimoda et al. | |
| 6,975,659 | B2 | 12/2005 | Nagano et al. | |
| 2003/0214042 | A1 * | 11/2003 | Miyazawa | 257/758 |
| 2005/0105573 | A1 * | 5/2005 | Hayashi et al. | 372/38.01 |

FOREIGN PATENT DOCUMENTS

| | | |
|---|---|---|
| JP | A-62-92869 | 4/1987 |
| JP | A-62-273862 | 11/1987 |
| JP | A-2002-29087 | 1/2002 |
| JP | A-2002-82633 | 3/2002 |
| JP | A 2002-144634 | 5/2002 |
| JP | A-2003-84221 | 3/2003 |
| JP | A-2004-95251 | 3/2004 |

* cited by examiner

*Primary Examiner* — Mark Robinson
*Assistant Examiner* — Erin Chiem
(74) *Attorney, Agent, or Firm* — Oliff & Berridge, PLC

(57) ABSTRACT

An optical head includes a plurality of unit regions repeatedly arrayed in one direction. Each region is constituted by a light-emitting element which is driven by a current to emit light, a control transistor which is connected in parallel with the light-emitting element, and which receives gray-scale data that specifies a high gray-scale level for the light-emitting element so as to be turned off and which receives gray-scale data that specifies a low gray-scale level for the light-emitting element so as to be turned on, and a driving transistor which is connected in series with the light-emitting element to generate a current. In each of the plurality of unit regions, a thermal resistance between the light-emitting element formed in the unit region and the control transistor formed in the unit region is smaller than a thermal resistance between the light-emitting element and a control transistor formed in a unit region adjacent to the unit region.

6 Claims, 11 Drawing Sheets

OPTICAL HEAD AND IMAGE FORMING APPARATUS

BACKGROUND

1. Technical Field

The present invention relates to an optical head which causes a current-drive-type light-emitting element, which is driven by a current to emit light, to emit light, thereby forming a latent image on an image carrier, and an image forming apparatus which forms an image using the optical head, 2. Related Art The above optical head is configured such that a plurality of unit circuits each including a current-drive-type light-emitting element used as a light source, and a driving transistor (an active element, such as a thin-film transistor) which generates a driving current are arrayed in one direction. A variation in characteristics may exist in the driving transistor. This tendency becomes significant when the driving transistor is a thin-film transistor. If such a variation exists, there is a possibility that an unevenness may occur in the gray-scale of a latent image. Thus, a technique of compensating (correcting) the variation in the characteristics of the driving transistor to reduce the unevenness in the gray-scale is suggested (refer to JP- A-2002-144634).

The current-drive-type light-emitting element has a temperature characteristic of emitting light with high luminance, if the temperature thereof is high. For example, even if the gray-scale data that specifies turn-on (high gray-scale level) is supplied to the same unit circuit two times, the light-emitting element will emit with different luminances if the temperatures of the light-emitting element when the light-emitting element of the unit circuit emits light according to the gray-scale data differ from each other. This leads to an unevenness in the gray-scale of a latent image. Accordingly, in an optical head used for an image forming apparatus, the temperature of the light-emitting element is kept constant during a period when an image is formed.

The temperature of the light-emitting element fluctuates according to a heat quantity which is obtained by subtracting the quantity of heat radiated from the light-emitting element by heat conduction from the applied heat quantity of the light-emitting element, i.e., the quantity of heat applied to the light-emitting element. Among the heat quantities applied to the light-emitting element, a large heat quantity is applied when the light-emitting element is used as a heat source, and a large heat quantity is applied when the driving transistor which drives the light-emitting element is used as a heat source. These heat quantities are generated while the light-emitting element is turned on, but are not generated while the light-emitting element is turned off. Accordingly, in order to keep the temperature of the light-emitting element constant, certain measures need to be taken. However, such measures have yet to be implemented.

Further, in the optical head, unit circuits are arranged in proximity to each other so as to be adjacent to each other. Thus, a heat quantity applied to a light-emitting element of a certain unit circuit (hereinafter referred to as “first unit circuit”) also includes a heat quantity where a light-emitting element or a driving transistor of a unit circuit (referred to as “second unit circuit”) adjacent to the first unit circuit is used as a heat source. As the resolution of an image to be formed is higher, that is, unit circuits adjacent to each other are closer to each other, this heat quantity becomes larger. Further, this heat quantity is generated while the light-emitting element of the second unit circuit is turned on, but is not generated while the light-emitting element is turned off. Therefore, in order to keep the temperature of the light-emitting element constant, certain measures need to be taken. However, such measures have not yet, to be implemented.

SUMMARY

An advantage of the invention is that it provides an optical head and an image forming apparatus in which the temperature of a current-drive-type light-emitting element is not greatly changed during a period when an image is formed.

According to an aspect of the invention, there is provided an optical head including a plurality of unit regions repeatedly arrayed in one direction. Each region is constituted by a light-emitting element which is driven by a current to emit light, a control transistor which is connected in parallel with the light-emitting element, and which receives gray-scale data that specifies a high gray-scale level for the light-emitting element so as to be turned off and which receives gray-scale data that specifies a low gray-scale level for the light-emitting element so as to be turned on, and a driving transistor which is connected in series with the light-emitting element to generate a current. In each of the plurality of unit regions, a thermal resistance between the light-emitting element formed in the unit region and the control transistor formed in the unit region is smaller than a thermal resistance between the light-emitting element and a control transistor formed in a unit region adjacent to the unit region.

The “light-emitting element which is driven by a current to emit light” means a current-drive-type light-emitting element, and is a concept including EL elements, such as an OLED (Organic Light-Emitting Diode) element and an inorganic EL (Electroluminescent) element. The expression “thermal resistance” is an index that shows the difficulty of transfer of heat, and is a concept including a parameter that is inversely proportional to heat conductivity. Further, the expression “smaller than a thermal resistance between~and a control transistor formed in a unit region adjacent to the unit region” means, when a plurality of adjacent unit regions exist, “smaller than any of thermal resistances between~and control transistors formed in a plurality of unit regions adjacent to the unit region”. Further, the expression “a plurality of unit regions are repeatedly arrayed in one direction” includes a conception “a plurality of unit regions are arrayed in a row,” “a plurality of unit regions are arrayed in one direction over a plurality of rows,” “a plurality of unit regions are arrayed in a zigzag fashion in one direction over a plurality of rows”.

In this optical head, the control transistor which is connected in parallel with the light-emitting element receives gray-scale data that specifies a high gray-scale level for the light-emitting element so as to be turned off, and which receives gray-scale data that specifies a low gray-scale level for the light-emitting element so as to be turned on. Thus, even if a current generated by the driving transistor which is connected in series with the light-emitting element specifies a high gray-scale level or specifies a low gray-scale level, the current flows certainly. Accordingly, if this optical head is used for formation of a latent image in an electrophotographic image forming apparatus, the temperature of the current-drive-type light-emitting element is not changed greatly during a period when an image is formed.

In the above optical head, preferably, the optical head is composed of a plurality of layers, the light-emitting element has a laminated light-emitting portion which emits light by flow of a current therethrough, and the light-emitting element does riot overlap both the control transistor arid the driving transistor as viewed from a direction vertical to the light-emitting portion in each of the plurality of unit regions. In this aspect, irrespective of an emission type, neither a driving transistor nor the control transistor may block the light from the light-emitting element excessively. Therefore, the degree of freedom in design becomes high. In addition, as the emission type of the optical head, there are a bottom-emission-type in which the light-emitting element is transmitted through and emitted from a substrate element is formed, a top emission type in which light emits in a direction opposite to that of the bottom emission type, and a dual emission type in which light emits in both directions.

In the above optical head, preferably, the optical head is composed of a plurality of layers, the light-emitting element has a laminated light-emitting portion which emits light by flow of a current therethrough, and the light-emitting element overlaps the control transistor as viewed from a direction vertical to the light-emitting portion in each of the plurality of unit regions. When an optical head is composed of a plurality of layers, the thickness thereof becomes extremely short compared with the length (the length of a unit region). Accordingly, the expression "the light-emitting element overlaps the control transistor means that the light-emitting element; and the control transistor are in sufficient proximity to each other". That is, this aspect has the structure in which the thermal resistance between the light-emitting element and the control transistor in each unit region becomes sufficiently small inevitably. Further, according to this aspect, the total area of the light-emitting portion which overlaps a light emission plane of the optical head can be ensured widely, i.e., the aperture ratio can be kept high.

Moreover, in this aspect, preferably, the light-emitting element is formed on an optically transparent first substrate, the driving transistor and the control transistor are formed on a second substrate, and the light-emitting element, the driving transistor, and the control transistor are arranged between the first substrate and the second substrate. According to this aspect, the light from the light-emitting element is transmitted through and emitted from the first substrate without being blocked by the driving transistor or the control transistor.

According to another aspect of the invention, there is provided an image forming apparatus including the optical head according to each of the above various aspects, and an image carrier. The image carrier is charged, the charged surface of the image carrier is irradiated with light from the optical head to form a latent image, and toner is caused to adhere to the latent image to form a developed image, and the developed image is transferred to an object. According to this image forming apparatus, it is possible to reduce an unevenness in the gray-scale of an image to be formed and to enjoy effects brought about by the optical head included in the image forming apparatus.

BRIEF DESCRIPTION OF THE DRAWINGS

The invention will be described with reference to the accompanying drawings, wherein like numbers reference like elements, and wherein.

DESCRIPTION OF EXEMPLARY EMBODIMENTS

A: Optical Head

Figure 1:
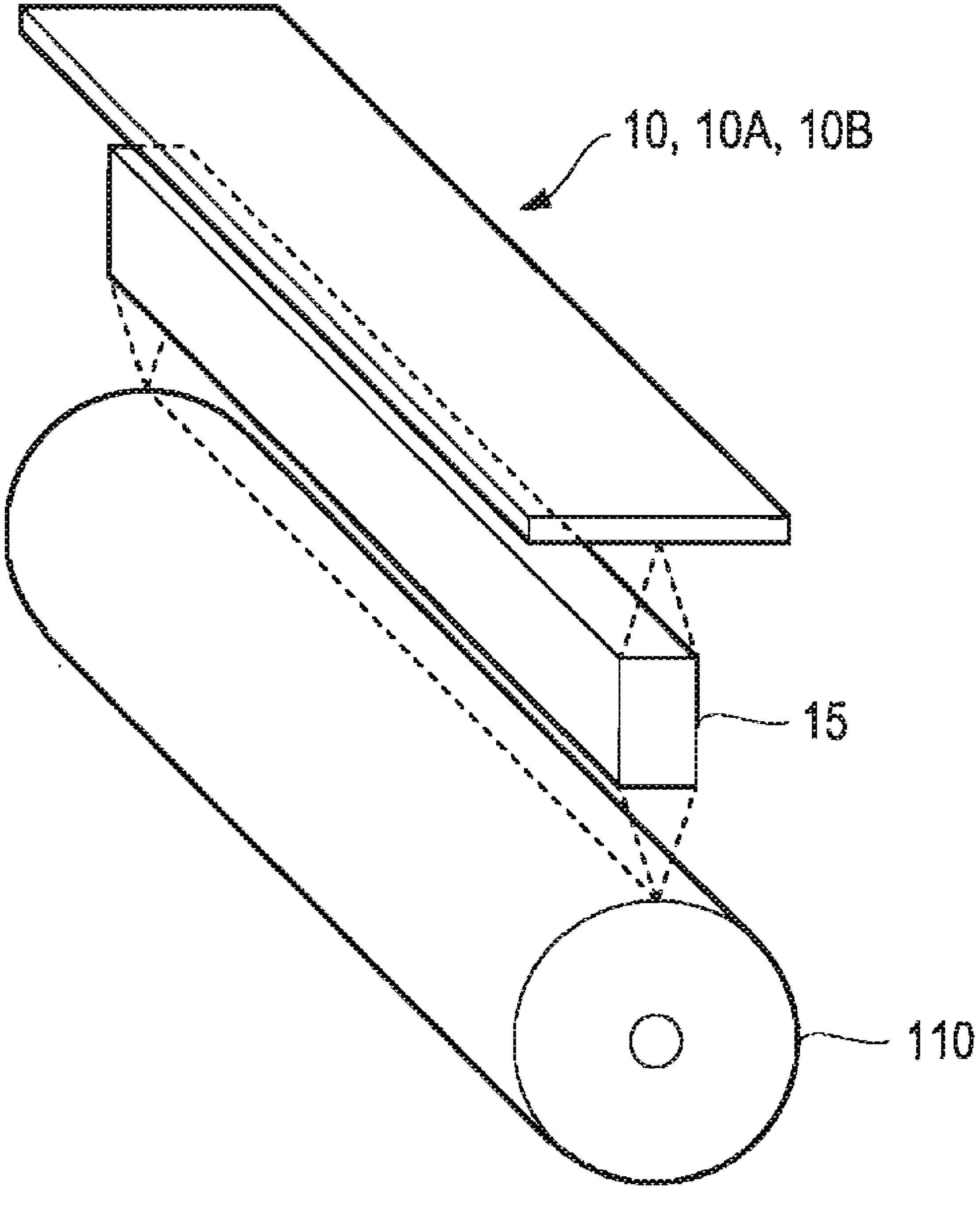
FIG. 1 is a perspective view showing a partial configuration of an image forming apparatus using an optical head according to an embodiment of the invention.

FIG. 1 is a perspective view showing a partial configuration of an image forming apparatus using an optical head (exposure device) 10 according to an embodiment of the invention. As shown in this FIG., the image forming apparatus includes the optical head 10, a light-condensing lens array 15, and a photoconductive drum 110. The optical head 10 includes a plurality of light-emitting elements arrayed in a straight line on the surface of a substrate. These light-emitting elements emit light selectively according to an aspect of an image to be printed on a recording material, such as a sheet of paper. The photoconductive drum 110 is supported by a rotary shaft extending in a main scanning direction, and rotates in a sub-scanning direction (direction in which the recording material is transported) in a state where an outer peripheral surface thereof is caused to face the optical head 10.

The light-condensing lens array 15 is disposed in a gap between the optical head 10 and the photoconductive drum 110. The light-condensing lens array 15 includes a plurality of gradient index lenses arrayed in an array so that the optical axis of each lens is directed to the optical head 10. An example of such a light-condensing lens array 15 is an SLA (SELFOC lens array) (SELFOC is a registered trademark of Nippon Sheet Glass Co., Ltd.) which is available from Nippon Sheet Glass Co., Ltd.

The light emitted from each light-emitting element of the optical head 10 passes through each gradient index lens of the light-condensing lens array 15, and thereafter arrives at the surface of the photoconductive drum 110. This is called "exposure," This exposure allows a latent image (electrostatic latent image) to be formed on the surface of the photoconductive drum 110 according to a desired image. In the present embodiment, a case where a latent image in which pixels are arrayed in a matrix over n columns in the horizontal direction (main scanning direction) and one row in the vertical direction (sub-scanning direction) is formed is assumed. In addition, the present embodiment may be modified such that pixels are arrayed over n columns in the horizontal directions and m rows in the vertical direction and a plurality of pixels are arrayed in a zigzag fashion.

A-1: Configuration of Optical Head 10

Figure 2:
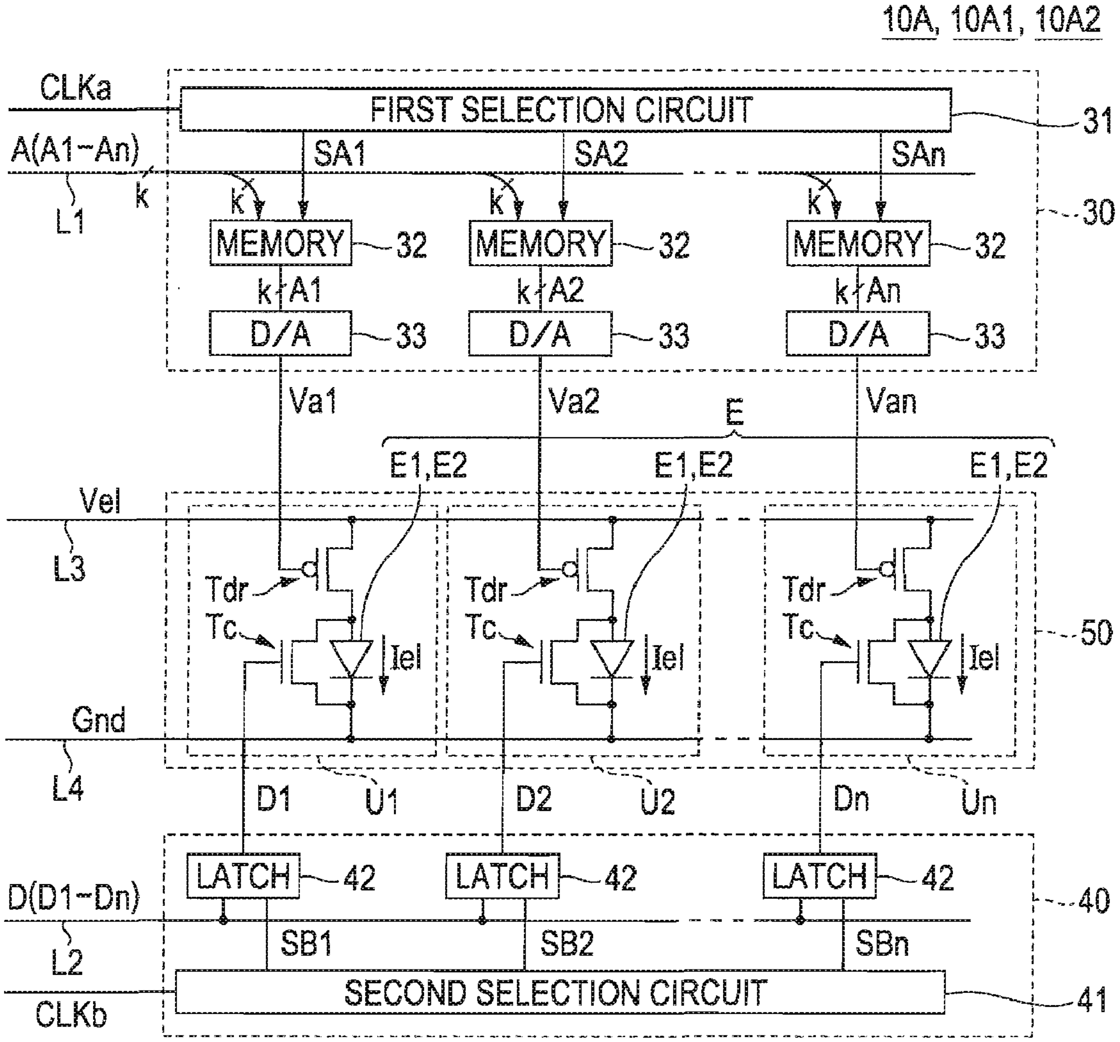
FIG. 2 is a block diagram showing an electrical configuration of an optical head that is a kind of the optical head.
Figure 3:
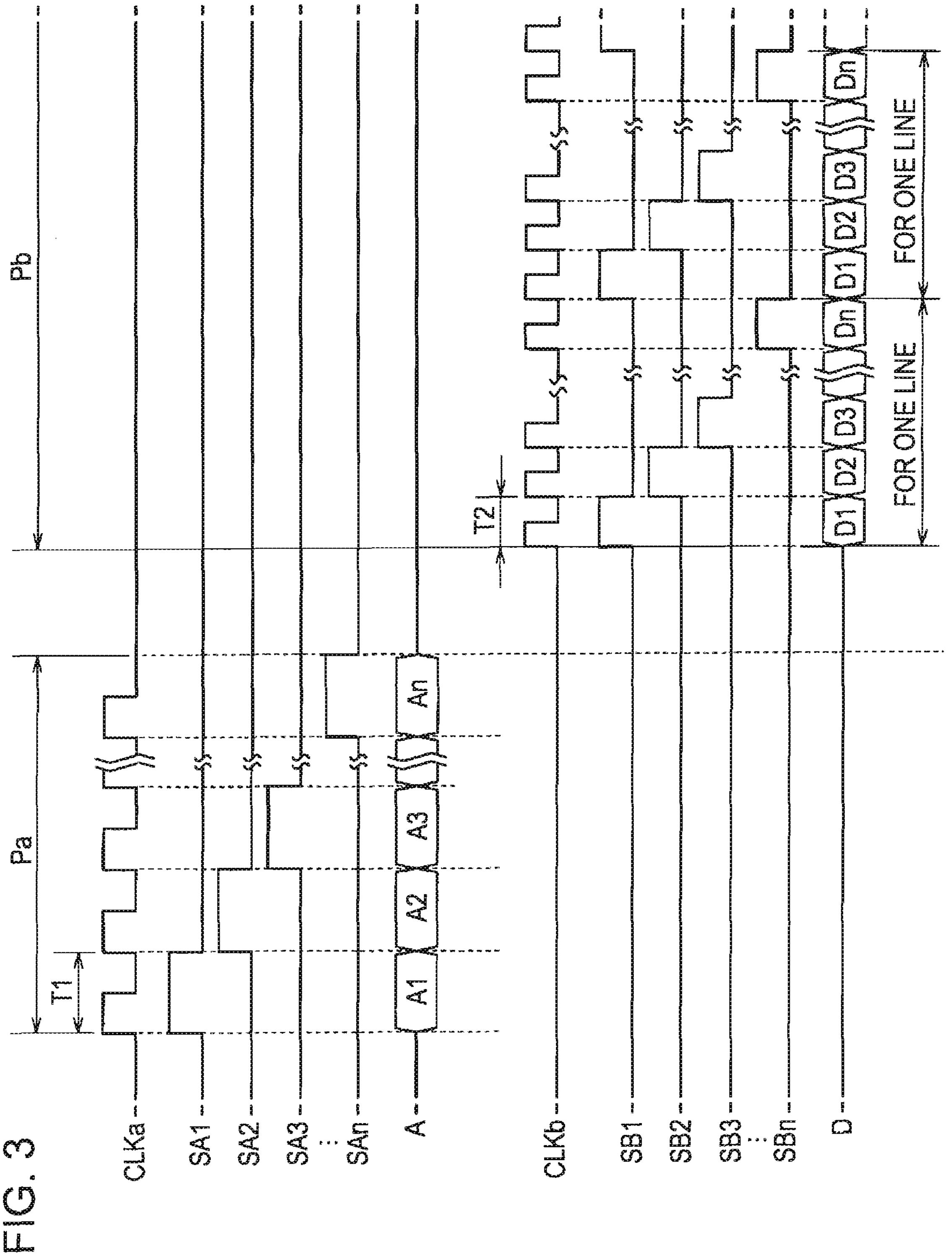
FIG. 3 is a timing chart illustrating the waveform of each signal used for driving the optical head.

The optical head 10 is roughly classified into an optical head 10A and an optical head 10B depending on the electrical configuration thereof. In the following description, when both the optical heads do not need to be distinguished from each other, the "optical head 10" is used. FIG. 2 is a block diagram showing an electrical configuration of the optical head 10A, and FIG. 3 is a timing chart illustrating the waveform of each signal used for driving the optical head 10. As shown in FIG. 2, the optical head 10 has a structure in which a first selection circuit section 30, a second selection circuit section 40, and a light-emitting circuit block 50 are arranged on the surface of a substrate 12. The light-emitting circuit block 50 includes "n" unit; circuits U each including a light-emitting element E. The unit circuits U1 to Un are arrayed in the main scanning direction, and adjacent unit circuits are arranged in proximity to each other so that a latent image can be formed with a resolution required for the image forming apparatus.

Various control signals, such as clock signals (for example, a clock signal CLKa and a clock signal CLKb), various kinds of data (for example, correction data A and gray-scale data D), and various potentials (for example, a power supply potential Vel as a high potential and a grounding potential Gnd as a low potential) are supplied to the optical head 10 from a control device (for example, CPU or a controller (hereinafter referred to as "higher-level device")) of the image forming apparatus. The light-emitting element E is a current-drive-type light-emitting element which emits light with a luminance according to a driving current Ie1 supplied thereto, and specifically, an OLED element in which a light-emitting layer made of an organic electroluminescent material is interposed between an anode and an cathode. Of course, the embodiment may be modified so that a current-drive-type light-emitting element (for example, inorganic EL element) other than the OLED element may be used.

Each of the first selection circuit section 30 and the second selection circuit section 40 is mounted on the substrate in the form of, for example, an IC chip. Further, a structure in which elements (for example, an active element, such as a thin-film transistor) to be formed on the surface of a substrate along with elements constituting the unit circuits U1 to Un constitute the second selection circuit section 40 or the first selection circuit section 30 (structure in which the unit circuits U1 to Un, the first selection circuit section 30, and the second selection circuit section 40 are integrally built on the surface of the substrate) is also adopted. As the substrate in this structure, a substrate made of, for example, an insulating material, such as glass or plastic is adopted suitably.

As shown in FIG. 3, a period during which the optical head 10 operates is divided into a first period Pa and a second period Pb. The second period Pb is a period during which the luminance of each light-emitting element E is actually controlled according to an image to be formed on a recording material. That is the second period Pb is a period during which an image according to emission of light of each light-emitting element E within the period is actually formed and output to a recording material. On the other hand, the first period Pa is a period during which control of the gray-scale of each light-emitting element E has stopped. For example, a period during which the state of each part of the optical head 10 is initialized immediately after supply of power, or a period (for example, a period (interval between sheets) during which an image is formed on a plurality of recording materials) during which the gray-scale of each light-emitting element E is not reflected in an image to be output to the outside correspond to the first period Pa.

As shown in FIG. 2, the first selection circuit section 30 includes a first selection circuit, "n" memories 32, and "n" D-A converters 33. Each of the "n" memories 32 and each of the "n" D-A converters 33 are provided so as to correspond to each of the unit circuits U1 to Un. The first selection circuit 31 is means for sequentially selecting the "n" memories 32 in the order of an array of the corresponding "n" unit circuits U (i.e., in the order from a unit circuit U1 toward a unit circuit Un) in the first period Pa. Specifically, the first selection circuit 31, which is a n-stage shift register, as shown in FIG. 3, sequentially shifts a predetermined pulse signal (not shown) with timing synchronized with a clock signal CLKa to thereby output first selection signals SA1 to SAn. Accordingly, the first selection signals SA1 to SAn sequentially shift to an active level in every T1 period of the clock signal CLKa. The shift of the first selection signal SAi ("i" is an integer which satisfies $1 \leqq i \leqq n$) to an active level means selection of the unit circuit Ui. In addition, operation of the first selection circuit 31 stops in the second period Pb (for example, supply of the clock signal CLKa stops).

The "n" memories 32, which store k-bit data and output the stored data, are connected in common to a signal line L1, The above "k" is a natural number. In the first period Pa, the correction data A of each of the "n" unit circuits U is serially supplied to the signal line L1 with timing synchronized with the clock signal CLKa. The correction data A is k-bit digital data which sets a current to be output from the drain of a driving transistor Tdr for each of the "n" unit circuits U. For example, correction data Ai is data which sets a current to be output from the drain of the driving transistor Tdr in the corresponding unit circuit Ui. One of the "n" memories 32 corresponding to the unit circuit Ui is supplied with the first selection signal SAi whose shift to an active level means selection of the unit circuit Ui, and the memory fetches and stores the correction data Ai from the signal line L1 when the first selection signal shifts to the active level.

The correction data A is generated in advance for every light-emitting element E according to a result obtained by measuring the luminance of each light-emitting element E in advance or according to the operation of the optical head 10 by a user. For example, after a driving current Idr having the same current value is supplied to each light-emitting element, the actual luminances of all the light-emitting elements E are measured. Then, on the basis of the measurement results (variations in the luminances before correction), the correction data A is determined for each of the unit circuits U1 to Un so that the luminances of all the light-emitting elements E may be made uniform.

The "n" D-A converters 33 input the correction data A output from the corresponding "n" memories 32, and supply a correction potential Va shown by this correction data A to the corresponding "n" unit circuits U. For example, the one of the "n" D-A converters 33 corresponding to the unit circuit Ui inputs the correction data Ai output from the corresponding one of the "n" memories 32, and supplies a correction potential Vai shown by this correction data Ai to the corresponding unit circuit U1.

As shown in FIG. 2, the second selection circuit section 40 includes a second selection circuit 41, and "n" latches 42. Each of the "n" latches 42 is provided so as to correspond to one of the unit circuits U1 to Un. The second selection circuit 41 is means (for example, n-stage shift register) for sequentially selecting each of the unit circuits U1 to Un, similarly to the first selection circuit 31. As shown in FIG. 3, the second selection circuit 41 sequentially shifts a predetermined pulse with timing synchronized with the clock signal CLKb to thereby output pulse signals SB1 to SBn. Accordingly, the pulse signals SB1 to SBn sequentially shift to an active level in every T2 (<period T1) period of the clock signal CLKb. The shift, of the pulse signal SBi to an active level means selection of the unit circuit Ui. In addition, operation of the second selection circuit 41 stops in the first period Pa (for example, supply of the clock signal CLKb stops).

The "n" latches 42, which output latched data, are connected in common to a signal line L2. In the second period Pb, the gray-scale data D of each of the "n" unit circuits U is serially supplied to the signal line L2 with timing synchronized with the clock signal CLKb. The gray-scale data D is one-bit data that specifies a gray-scale level (high gray-scale level/low gray-scale level) for each of the "n" unit circuits U. For example, the gray-scale data Di is data that specifies the gray-scale level of the light-emitting element E in the unit circuit Ui. As shown in FIG. 3, the gray-scale data D1 to Dn are sequentially input to the optical head 10 in synchronization with the clock signal CLKb. In a period during which the pulse signal SBi is maintained at high level, the gray-scale data Di is supplied to the signal line L2. The one of the "n" latches 42 corresponding to the unit circuit Ui is supplied with the second selection signal SBi whose shift to an active level means selection of the unit circuit Ui, and the one of the "n" latches 42 latches the gray-scale data Di from the signal line L2 and supplies the latched gray-scale data Di to the unit circuit Ui, when the second selection signal shifts to the active level.

The present embodiment may be modified such that the "n" memories 32 and the "n" latches 42 are arranged in two stages. In this configuration, in the unit circuits U1 to Un, the correction data A1 to An are point-sequentially latched by first-stage memories 32, and thereafter simultaneously (line-sequentially) latched by second-stage memories 32 with predetermined timing, while the gray-scale data D1 to Dn are point-sequentially latched by first-stage latches 42, and thereafter simultaneously (line-sequentially) latched by second-stage latches 42 with predetermined timing.

A-2: Configuration of Optical Head 10A

As shown in FIG. 2, the "n" unit circuits U are connected in common to a feed line L3. The power supply potential Vel is supplied to the feed line L3. The optical head 10A and the optical head 10B are different from each other in the configuration of each of the "n" unit circuits U. Here, the configuration of each of the "n" unit circuits U in the optical head 10A will be described. In each of the "n" unit circuits U, a p-channel-type driving transistor Tdr and a light-emitting element E are interposed in series in a path from the feed line L3 (power supply potential Vel) to a grounding line L4 (grounding potential Grid). The driving transistor Tdr is means for generating a driving current lei according to a voltage Vgs between the source and gate thereof. The source of the driving transistor is connected to the feed line L3, and the drain of the driving transistor is connected to the anode of the light-emitting element E. The correction potential Va is supplied to the gate of the driving transistor Tdr from a corresponding one of the "n" D-A converters 33. For example, the correction potential Vai is supplied to the gate of the driving transistor Tdr of the unit circuit Ui from the corresponding one of the "n" D-A converters 33. The cathode of the light-emitting element E is connected to the grounding line L4.

In the above path, a control transistor Tc is connected in parallel with the light-emitting element E. The control transistor Tc is an n-channel-type transistor, and the drain thereof is connected to the anode of the light-emitting element E, and the source thereof is connected to the grounding line L4. The gray-scale data D is supplied to the gate of the control transistor Tc from a corresponding latch 42. For example, the gray-scale data Di is supplied to the gate of the control transistor Tc of the unit circuit Ui, whereby the potential thereof becomes the potential of the gray-scale data Di. Accordingly, the control transistor Tc is turned on and off according to the corresponding gray-scale data D.

Further, the control transistor Tc is designed such that the impedance thereof in an ON state becomes sufficiently low compared with the light-emitting element E, that is, most of a current to be output from the drain of the driving transistor Tdr in an ON state passes through the control transistor Tc. Accordingly, the luminance of the light-emitting element E in a case where the control transistor Tc is turned on becomes sufficiently low, and the same latent image as that in a case where the light-emitting element E does not emit light is obtained. That is, the control transistor Tc functions as means for controlling emission of light of the light-emitting element E according to the gray-scale data D supplied to the gate thereof. Further, the control transistor Tc also forms an alternative route for a current to be output from the drain of the driving transistor Tdr, and makes the power consumption of the unit circuit Ui independent of the gray-scale data D.

A-3: Structure of Optical Head 10A1

Figure 4:
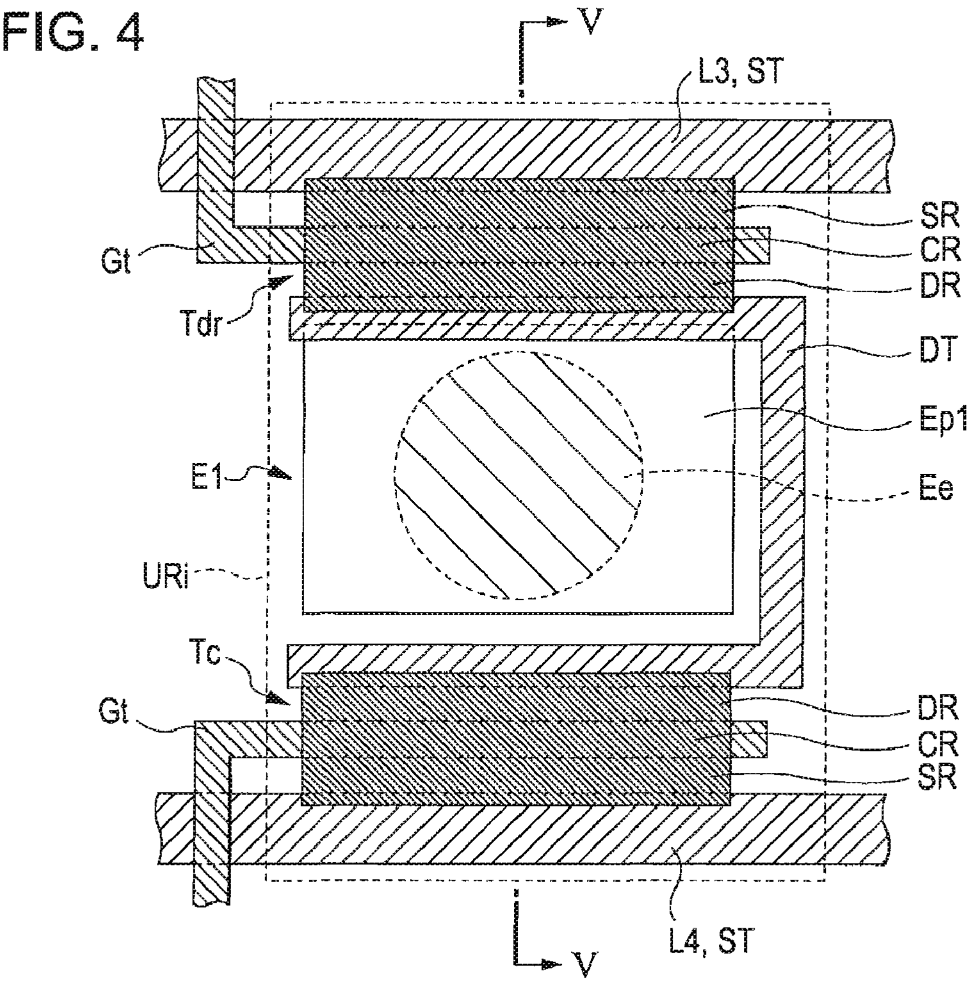
FIG. 4 is a plan view when an optical head that is a kind of the optical head is viewed from a photoconductive drum.
Figure 5:
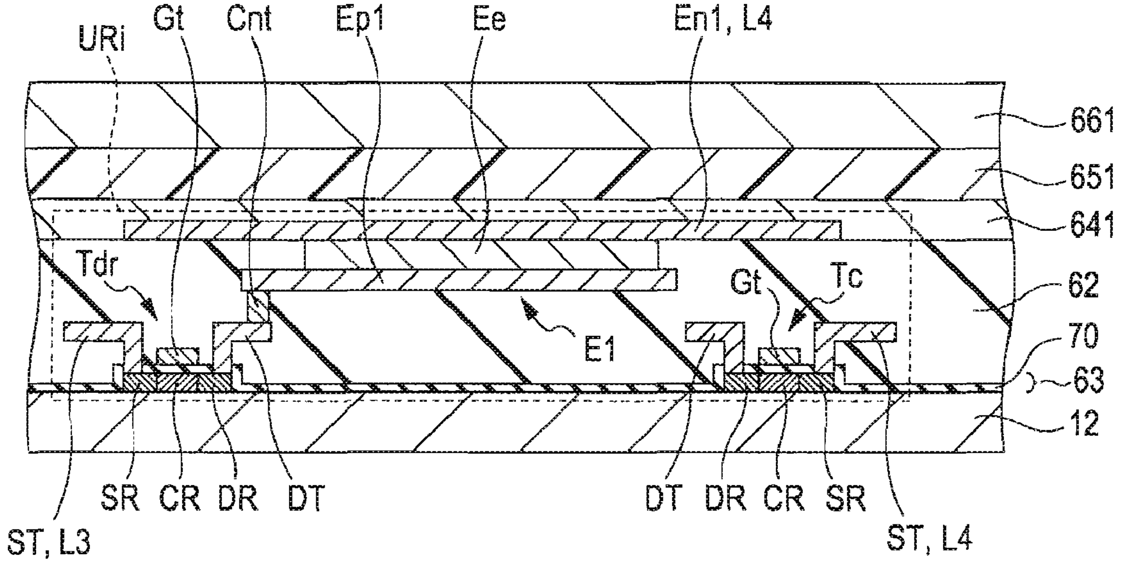
FIG. 5 is a sectional view taken along a line A-A' in FIG. 4.

Next, the structure of the optical head 10A will be described. As the structure of the optical head 10A, various forms can be considered. Among these forms, the structure of an optical head (hereinafter referred to as "optical head 10A1") in a certain form will first be described. FIG. 4 is a plan view when the optical head 10A1 is viewed from the photoconductive drum 110, and FIG. 5 is a sectional view taken along a line A-A' of FIG. 4. Illustration of members, such as a substrate, is omitted in FIG. 4 for simplicity. Further, a unit region URi corresponding to the unit circuit Ui is shown in FIGS. 4 and 5 as an example of a unit region UR that is a region occupied by one of the "n" unit circuits U. The structure of other unit regions UR is the same as the structure of the unit region URi. Further, in the following description, the light-emitting element E of the optical head 10A1 is referred to as "light-emitting element E1."

As shown in FIG. 5, the driving transistor Tdr, the control transistor Tc, the feed line L3, and the grounding line L4 are formed on the substrate 12. A semiconductor layer 63 is formed on the surface of the substrate 12 with a semiconductor material, such as silicon, and a gate electrode Gt is formed on the semiconductor layer 6 3 with an insulating layer 70 therebetween in every transistor. Each transistor includes a gate electrode Gt, source electrode ST, and drain electrode DT, and the semiconductor layer 63 in the vicinity of the gate electrode Gt. The semiconductor layer 63 included in each transistor is a thin-film transistor including a channel region CR which faces the gate electrode Gt, and a source region SR and a drain region DR which sandwich the channel region CR therebetween. The source region SR is electrically connected to the source electrode ST, and the drain region DR is electrically connected to the drain electrode DT. The source electrode ST of the driving transistor Tdr is a portion of the feed line L3, and the source electrode ST of the control transistor Tc is a portion of the grounding line L4. As shown in FIG. 4, in each unit circuit U, the drain electrode DT of the driving transistor Tdr also serves as the drain electrode DT of the control transistor Tc.

The driving transistor Tdr and the control transistor Tc are covered with the insulating layer 62 formed from a transparent material. The light-emitting element E1 is formed on the insulating layer 62. The light-emitting element E1 includes an anode Ep1 that is a transparent electrode formed from a material, such as ITO (indium tin oxide), a light-emitting portion Ee, a common cathode En1 that is an electrode formed by laminating an alkaline metal material, such as Ca, and a low-resistance material, such as aluminum. The light-emitting portion Ee is a portion which is sandwiched between the anode Ep1 and the common cathode En1 in the light-emitting layer formed from an organic electroluminescent material, and which emits light by flow of a current therethrough. The light-emitting portion Ee is a layer above the anode Ep1 and a layer below the common cathode En1. The anode Ep1 is electrically connected to the drain electrode DT of the driving transistor Tdr through a contact Cnt. The common cathode En1 is common to the unit circuits U1 to Un.

A thermal resistance between the light-emitting element E1 and the control transistor Tc in each of the "n" unit, circuits U is sufficiently small. Taking a concrete example, the thermal resistance between the light-emitting element E1 and the control transistor Tc in the unit circuit Ui is smaller than a thermal resistance between the light-emitting element E1 and a control transistor Tc of a unit circuit Ui+1, and is smaller than a thermal resistance between the light-emitting element E1 and a control transistor Tc of a unit circuit Ui−1. Thermal resistance is an index that shows the ability of a material to resist the flow of heat. A parameter that is inversely proportional to heat conductivity can be adopted as the thermal resistance.

A passivation layer 641 is formed on the light-emitting element E1 so as to cover the common cathode En1, an adhesion layer 651 is formed on the passivation layer 641, and a sealing substrate 661 is overlapped on the adhesion layer 651. The passivation layer 641 is formed from a material, such as silicon nitride or silicon oxide, and the sealing substrate 661 is formed from a material, such as glass or plastic. Both the passivation layer and the sealing substrate play a role in protecting the light-emitting element E1 from ambient air or moisture. The adhesion layer 651 is formed from an adhesive, such as thermosetting resin or photo-curable resin, and plays a role in bonding the passivation layer 641 and the sealing substrate 661 together. In addition, the sealing method of the light-emitting element E1 is not limited to a sealing method of filling a space between a substrate in which the above light-emitting element is formed and a sealing substrate with an adhesive. For example, a sealing method of filling a space between a light-emitting element and a sealing substrate with inert gas or inactive liquid, such as nitrogen or rare gas, and a method of forming a thin film like the above passivation layer on a light-emitting element, thereby performing sealing, may be adopted.

A-4: Heat Conduction of Optical Head 10A1

FIGS. 6, 7, 9, and 10 are views illustrating the behavior of heat conduction of three unit regions URi−1 and URi(s), and URi+1 in the light-emitting circuit block 50. A driving transistor region TdrR, a control transistor region TcR, and a light-emitting element region ER, which serve as major heat sources by flow of an electric current, are shown in these Figures. The driving transistor region TdrR is a region through which an electric current flows in the region occupied by the driving transistor Tdr. The control transistor region TcR is a region through which an electric current flows in the region occupied by the control transistor Tc. The light-emitting element region ER is a region through which an electric current flows in the region occupied by the light-emitting element E1, and includes a region occupied by the light-emitting portion Ee.

In FIGS. 6, 7, 9, and 10, the behaviors of heat conduction on a cross section obtained by cutting the light-emitting circuit block 50 parallel to an array direction of the unit circuits U are shown by concentric circles. Specifically, the behavior of heat conduction where the light-emitting element region ER is used as a heat source is shown by concentric circles of dotted lines, the behavior of heat conduction where the driving transistor region TdrR is used as a heat source is shown by concentric circles of solid lines, and the behavior of heat conduction where the control transistor region TcR is used as a heat source is shown by concentric circles of one-dotted chain lines. In addition, although the heat from a heat source is transferred radially, the heat conductivity of the light-emitting circuit block 50 is not uniform and the heat source has a shape. Thus, even if positions where the quantities of heat to be transferred are equal to one another are connected together, they do not make a circle actually. Further, major heat sources are heat sources which have a sufficiently great effect on the quantity of heat applied to the light-emitting element region ER. As candidates for these heat sources, the light-emitting element region ER, the driving transistor region TdrR, and the control transistor region TcR can be exemplified. Further, the above cross section is common to FIGS. 6 and 9 and is common to FIGS. 7 and 10.

Case 1

Figure 6:
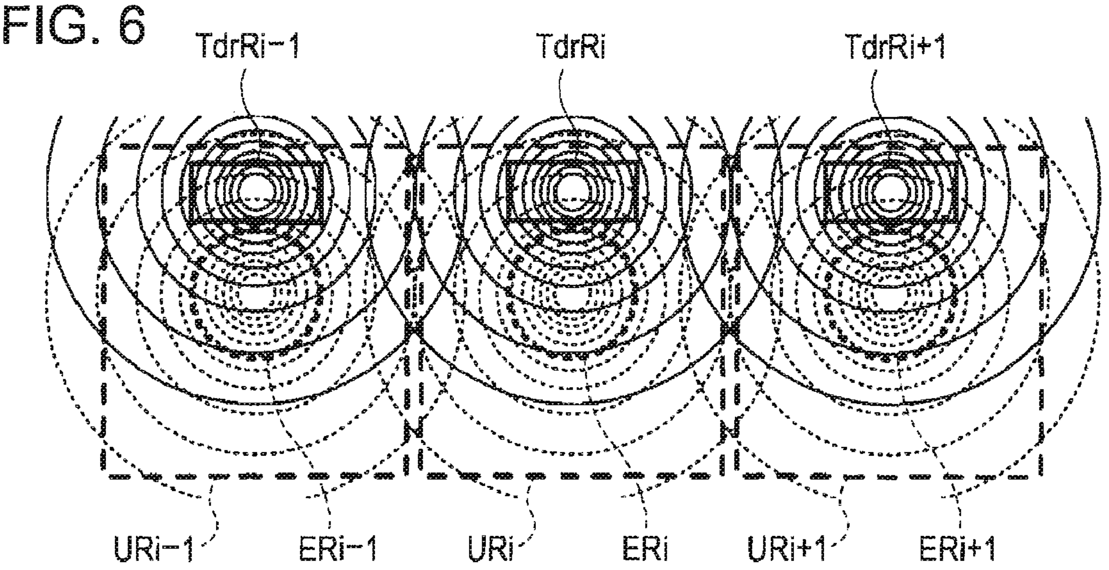
FIG. 6 is a view illustrating the behavior of heat conduction in a light-emitting circuit block.
Figure 7:
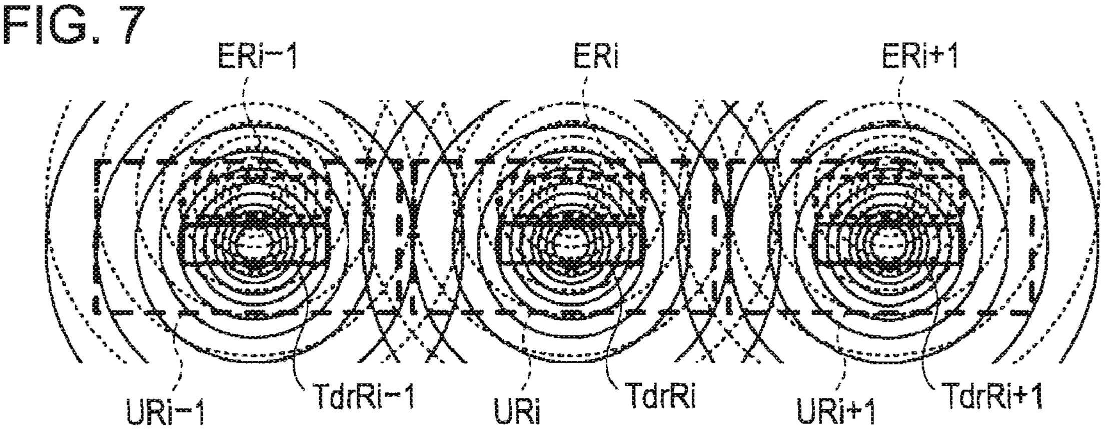
FIG. 7 is a view illustrating the behavior of heat conduction in the light-emitting circuit block.

FIGS. 6 and 7 show the behaviors of heat conduction in a case (Case 1) where all gray-scale data Di−1, Di, and Di+1 are data that specify a high gray-scale level. In Case 1, the control transistor Tc is turned off in the unit circuits Ui−1, Ui, and Ui+1. Accordingly, the whole current generated by the driving transistor Tdr becomes the driving current lei, and the light-emitting element El emits light with a luminance according to this driving current Ie1. In the unit circuits Ui−1, Ui, and Ui+1, electric potentials Vai−1, Vai, and Vai+1 according to correction data Ai−1, Ai, and Ai+1 are supplied to the gate of the driving transistor Tdr. Thus, the driving transistor Tdr generates a current that the luminance of the light-emitting element El becomes constant. Therefore, in Case 1, in the unit circuits Ui−1, Ui, and Ui+1, a current which causes the light-emitting element E1 to emit light flows through the driving transistor Tdr and the light-emitting element E1, and thereby the light-emitting element E1 emits light. As a result, as shown in FIGS. 6 and 7, in the unit regions URi−1, URi, and URi+1, the driving transistor region TdrR and the light-emitting element region ER serve as major heat sources.

Figure 8:
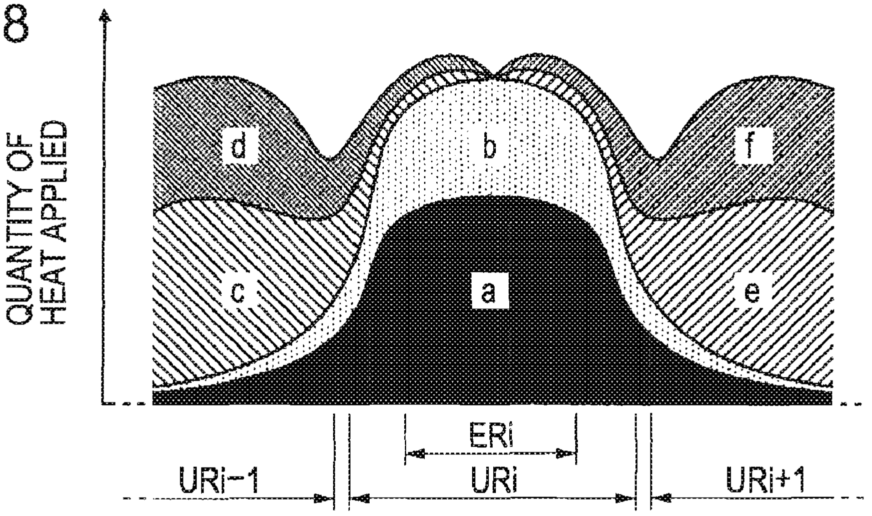
FIG. 8 is a buildup graph showing an example of the distribution of the applied heat quantity in the light-emitting circuit block.

The distribution of the applied heat quantity in Case 1 is as shown in FIG. 8, for example. The applied heat quantity in a certain position is an applied heat quantity of a substance in the position. Specifically, the applied heat quantity is determined by subtracting the quantity of heat applied to other substances by heat conduction from the sum of the quantity of heat generated by the substance itself and the quantity of heat applied from other substance by heat conduction. FIG. 8 is a buildup graph showing an example of the distribution of the applied heat quantity in the light-emitting circuit block 50, and shows the distribution in a straight line passing through the light-emitting element regions ER of the unit circuits Ui−1, Ui, and Ui+1. In this graph, the applied heat quantity is expressed by buildup of regions "a" to "f". The regions "a" to "f" correspond to heat sources different from one another, and the quantity of heat quantity applied from a corresponding heat source is shown by the width (length along the axis of ordinate) of each region. The heat sources corresponding to the regions a to f are a light-emitting element region ERi of the unit region URi, a driving transistor region TdrRi of the unit region Uri, a light-emitting element region ERi−1 of a unit region URi−1, a driving transistor region TdrRi−1 of the unit region URi−1, a light-emitting element region ERi+1 of a unit region URi+1, and a driving transistor region TdrRi+1 of the unit region URi+1. In addition, illustration of the quantity of heat exchanged among regions other than the unit region URi−1, URi, and URi+1 is omitted in FIG. 8 for simplicity. Further, although the regions c to f are seen in FIG. 8 as being broken on the way, the regions c to f actually extends without being broken despite very narrow width.

In Case 1, for example, the quantity of heat applied to the light-emitting element region ERi correspond to a total quantity of a heat quantity (region a) where the light-emitting element region ERi is used as a heat source, a heat quantity (region b) where the driving transistor region TdrRi is used as a heat source, a heat quantity (region c) where the light-emitting element region ERi−1 is used as a heat source, a heat quantity (region d) which the driving transistor region TdrRi−1 is used as a heat source, a heat quantity (region f) where the light-emitting element region ERi+1 is used as a heat source, and a heat quantity (region e) where the driving transistor region TdrRi+1 is used as a heat source.

Case 2

Figure 9:
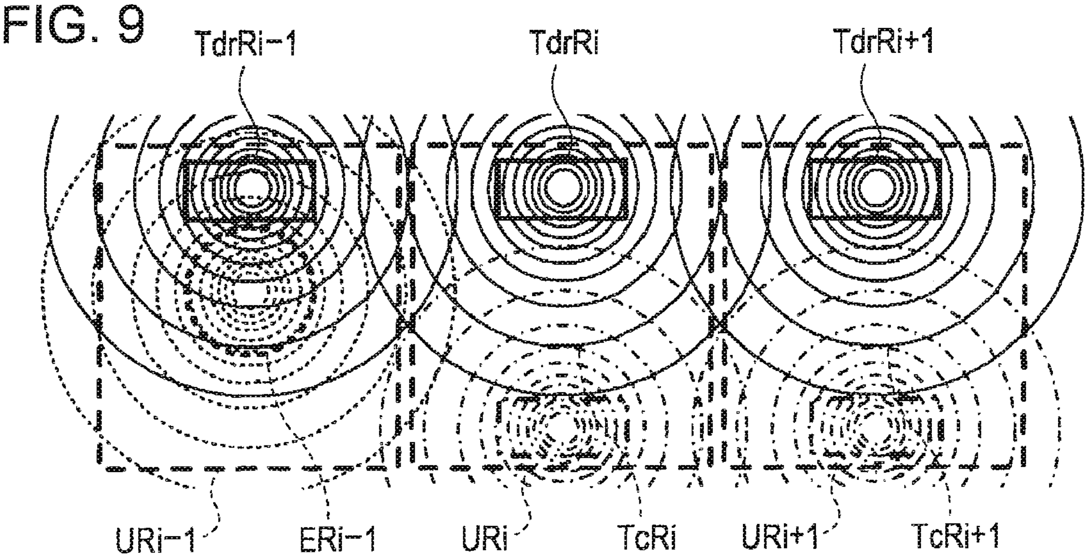
FIG. 9 is a view illustrating the behavior of heat conduction in the light-emitting circuit block.
Figure 10:
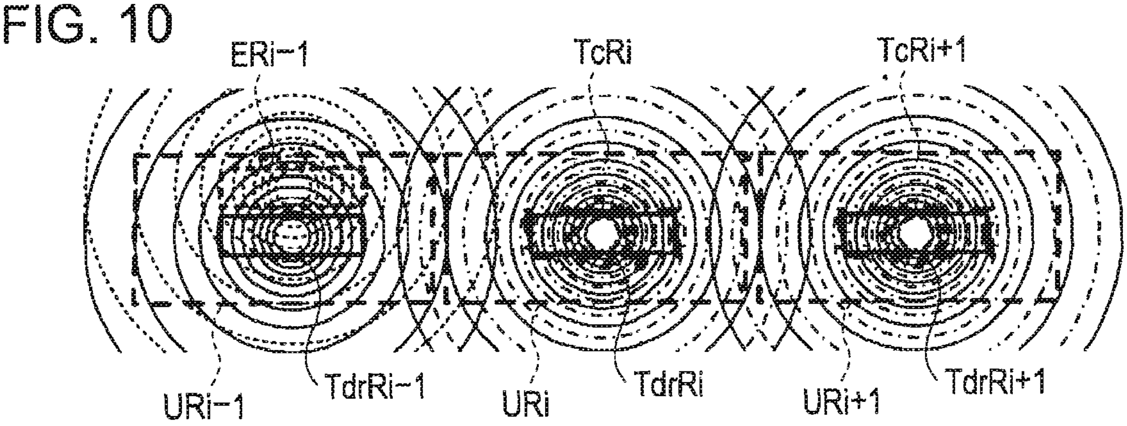
FIG. 10 is a view illustrating the behavior of heat conduction in the light-emitting circuit block.

FIGS. 9 and 10 show the behavior of heat conduction in a case (Case 2) where the gray-scale data Di−1 is data that specifies a high gray-scale level, and the gray-scale data Di and Di+1 are data that specifies a low gray-scale level. In this case, the control transistor Tc is turned off in the unit circuit Ui−1, and the control transistor Tc is turned on in the unit circuit Ui and Ui+1. Accordingly, in the unit circuit Ui−1, a current which causes the light-emitting element E1 to emit light flows through the driving transistor Tdr and the light-emitting element E1, and thereby the light-emitting element E1 emits light. Therefore, in the unit region URi−1, as shown in FIGS. 9 and 10, the driving transistor region TdrRi−1 and the light-emitting element region ERi−1 become major heat sources. On the other hand, in the unit circuits Ui and Ui+1, a current generated by the driving transistor Tdr will almost pass through the control transistor Tc. Therefore, as shown in FIGS. 9 and 10, the driving transistor region TdrRi−1 and the control transistor region TcRi−1 become major heat sources in the unit region URi, and the driving transistor region TdrRi+1 and the control transistor region TcRi+1 become major heat sources in the unit region URi+1. As such, in the unit circuit U, when the light-emitting element E emits light to generate heat, the control transistor Tc does not generate heat, but when the control transistor Tc does not emit light, the light-emitting element E generates heat. That is, when attention is paid to generation of heat, the light-emitting element E and the control transistor Tc function complimentarily.

Figure 11:
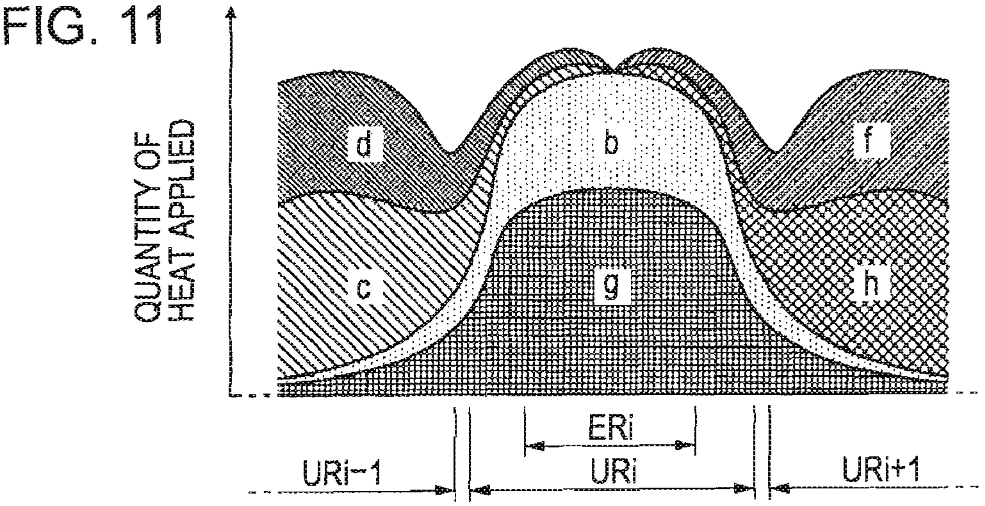
FIG. 11 is a buildup graph showing an example of the distribution of the applied heat quantity in the light-emitting circuit block.

The distribution of the applied heat quantity in Case 2 is as shown in FIG. 11, for example. FIG. 11 is a buildup graph, similar to FIG. 8, where a region g exists instead of a region a, and a region h exists instead of a region e. A heat source corresponding to the region g is the control transistor region TcR of the unit region URi, and a heat source corresponding to the region h is the control transistor region TcR of the unit region UiR.

In Case 2, for example, the quantity of heat applied to the light-emitting element region ERi of the unit region URi correspond to a total quantity of a heat quantity (region g) where a control transistor region TcRi is used as a heat source, a heat quantity (region b) where the driving transistor region TdrRi is used as a heat source, a heat quantity (region c) where the light-emitting element region ERi−1 is used as a heat source, a heat quantity (region d) which the driving transistor region TdrRi−1 is used as a heat source, a heat quantity (region h) where the control transistor region TcRi+1 is used as a heat source, and a heat quantity (region f) where the driving transistor region TdrRi+1 is used as a heat source.

Even in any of Case 1 and Case 2, the potential Vai according to the correction data Ai is supplied to the gate of the driving transistor Tdr of the unit circuit Ui. Thus, the driving transistor Tdr of the unit circuit Ui generates a constant current. This current flows into the grounding line L4 through the light-emitting element E1 in Case 1, and flows into the grounding line L4 through the control transistor Tc (and the light-emitting element E1) in Case 2. Accordingly, the power consumptions of the unit circuits Ui in Case 1 and Case 2 becomes equal to each other. Therefore, the calorific values of the unit regions URi in Case 1 and Case 2 becomes almost equal to each other. This is also applied to the unit region URi+1.

That is, the calorific value of the unit regions UR becomes approximately constant without depending on the gray-scale data D. Further, the thermal resistance between the light-emitting element E1 and the control transistor Tc in the unit region URi is sufficiently small. Therefore, the quantity of heat which is radiated by a control transistor Tc of a certain unit region UR and is applied to a light-emitting element region ER inside and outside the unit region UR (the quantity of heat the region g of FIG. 11 if the unit region UR is the unit region URi) becomes approximately equal to the quantity of heat which is generated when a whole current generated by a driving transistor Tdr of the unit region UR is used as the driving current Iei and is applied to the light-emitting element region ER inside and outside the unit region UR (the quantity of heat of the region a of FIG. 8 if the unit region UR is the unit region URi).

A-5: Effects of Optical Head 10A1

According to the optical head 10A1 as described above, the temperature of each light-emitting element E1 is kept approximately constant in the second period Pb during which the luminance of each light-emitting element E1 is actually controlled according to an image to be formed on a recording material. Therefore, the luminance of each light-emitting element E1 when being turned on becomes approximately constant.

The optical head 10A1 is a bottom-emission-type light-emitting device in which the light from a light-emitting element is transmitted through and emitted from a substrate in which the light-emitting element is formed. In the bottom-emission-type light-emitting device, it is necessary to prevent the light which travels from the light-emitting element to the substrate 12 from being blocked. In the optical head 10A1, not only the driving transistor Tdr but also the control transistor Tc exists between the layer of the light-emitting element E1, and the substrate 12. Thus, generally thinking, it is difficult to adopt the bottom-emission-type structure. However, in the optical head 10A1, neither the driving transistor region TdrR nor the control transistor TcR overlap the light-emitting element region ER. Thus, even if the bottom-emission-type structure is adopted, the light which travels from a light-emitting element to the substrate 12 is hardly blocked.

In the optical head 10A1, neither the driving transistor region TdrR nor the control transistor TcR overlaps the light-emitting element region ER. Thus, it is possible to adopt arbitrary emission types and the degree of freedom in design is high. As emission types other than the bottom-emission-type, there are a top emission type in which light emits in a direction opposite to that of the bottom emission type, and a dual emission type in which light emits in both directions.

A-6: Structure of Optical Head 10A2

Figure 12:
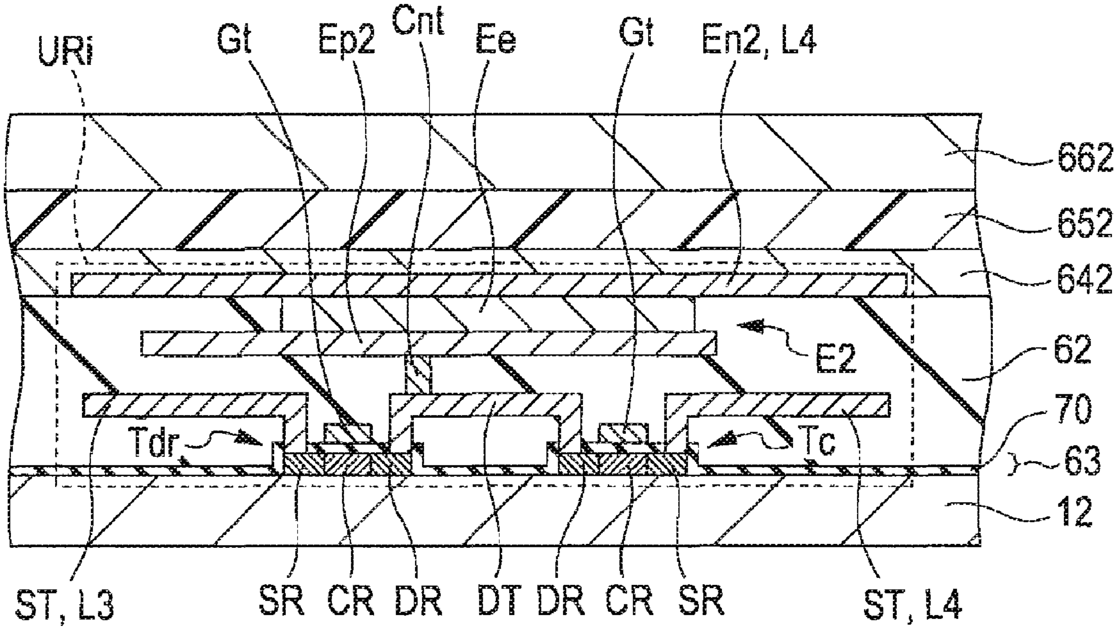
FIG. 12 is a section view of a light-emitting circuit block of an optical head that is a kind of the optical head.

As long as the top emission type structure can be obtained by modifying the optical head 10A1, either the driving transistor region TdrR or the control transistor TcR may overlap the light-emitting element region ER. A sectional view of a light-emitting circuit block 50 of an optical head 10A2 having a structure in which the driving transistor region TdrR and the control transistor TcR overlap the light-emitting element region ER is shown in FIG. 12. In this FIG., portions common to those in FIG. 5 are denoted by the same reference numerals. In addition, in the following description, a light-emitting element E of the optical head 10A2 is referred to as "light-emitting element E2."

As shown in FIG. 12, in the optical head 10A2, the driving transistor Tdr and the control transistor Tc are arranged in proximity to each other on the substrate 12, and overlap the light-emitting element E2. A drain electrode DT is common to both the transistors. The light-emitting element E2 is formed on the insulating layer 62 which covers the driving transistor Tdr and the control transistor Tc. The light-emitting element E2 includes an anode Ep2 that is an electrode formed by laminating a light-reflecting material, such as aluminum, and a transparent material, such as ITO (Indium Tin Oxide) or that is an electrode formed from a noble metal material, such as silver, a light-emitting portion Ee, and a common cathode En2 that is a transparent electrode formed as a thin film of 10 nm or less using a material, such as Ca or MgAg. In this structure, the light-emitting portion Ee is a portion which is sandwiched between the anode Ep2 and the common cathode En2 in the light-emitting layer formed from an organic electroluminescent material, and which emits light by flow of a current therethrough. The light-emitting portion Ee is a layer above the anode Ep2 and a layer below the common cathode En2. The anode Ep2 is electrically connected to the drain electrode DT common to the driving transistor Tdr and the control transistor Tc through a contact Cnt. The common cathode En2 is common to all the unit circuits U.

A passivation layer 642 is formed on the light-emitting element E2 so as to cover the common cathode En2, an adhesion layer 652 is formed on the passivation layer 642, and a sealing substrate 662 is overlapped on the adhesion layer 652. The passivation layer 642 is formed from a transparent material, such as silicon nitride or silicon oxide, and the sealing substrate 662 is formed from a transparent material, such as glass or plastic. Both the passivation layer and the sealing substrate play a role to protect the light-emitting element E2 from ambient air or moisture. The adhesion layer 652 is formed from an adhesive, such as thermosetting transparent resin or photo-curable transparent resin, and plays a role to bond the passivation layer 642 and the sealing substrate 662 together. In addition, the sealing method of the light-emitting element E2 is not limited to a sealing method of filling a space between a substrate in which the above light-emitting element is formed and a sealing substrate with an adhesive. For example, a sealing method of filling a space between a light-emitting element and a sealing substrate with inert gas or inactive liquid, such as nitrogen or rare gas, and a method of forming a thin film like the above passivation layer on a light-emitting element, thereby performing sealing, may be adopted. Further, since the optical head 10A2 is a top emission type light-emitting device, the substrate 12 and the insulating layer 62 may be formed from a light-blocking material.

A-7: Effects of Optical Head 10A2

Since the optical head 10A2 is formed by building up a plurality of layers, the thickness thereof is remarkably short compared with the length thereof (the length thereof in the array direction of the unit circuits U1 to Un). Further, in the optical head 10A2, the light-emitting element E2 overlaps the control transistor Tc in the unit region UR. Therefore, in each unit region UR, the light-emitting element E2 and the control transistor Tc inevitably are in sufficient proximity to each other. That is, the optical head 10A2 has a structure in which the thermal resistance between the light-emitting element E2 and the control transistor Tc in the unit circuit Ui is smaller than a thermal resistance between the light-emitting element E2 and a control transistor Tc of a unit circuit Ui+1, and is smaller than a thermal resistance between the light-emitting element E2 and a control transistor Tc of a unit circuit Ui−1.

Figure 13:
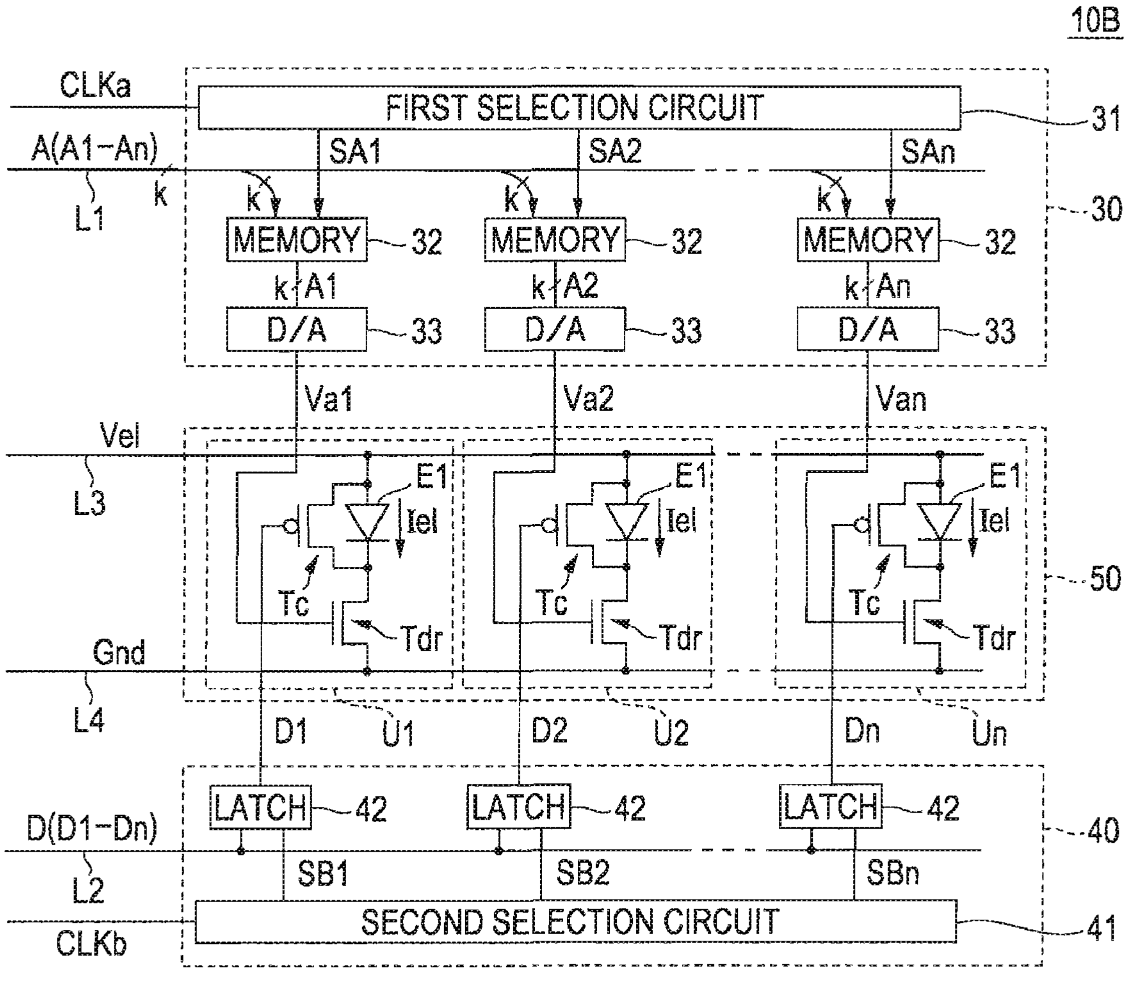
FIG. 13 is a block diagram showing an electrical configuration of an optical head that is a kind of the optical head.
Figure 14:
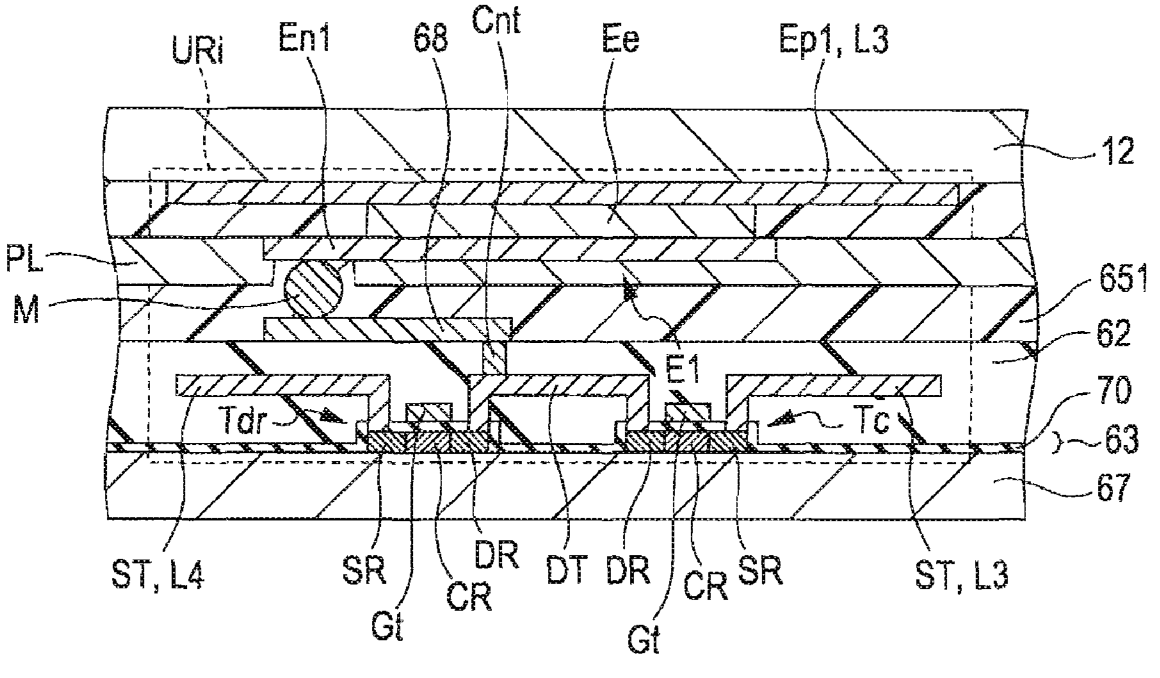
FIG. 14 is a sectional view of a light-emitting circuit block of the optical head.

Further, similarly to the optical head 10A1, even if any kind of gray-scale data D is supplied, the temperature of each of a plurality of the light-emitting elements E2 becomes approximately constant. Accordingly, according to the optical head 10A2, the same effects as those obtained by the optical head 10A1 can be obtained. However, it is not possible to modify the optical head 10A2 to use it as a bottom-emission-type or dual emission type optical head. In addition, according to the optical head 10A2, since the control transistor Tc can overlap the light-emitting element E2, the total area of the light-emitting portion Ee which overlaps a light emission plane of the optical head 10A2 can be ensured widely, A-8: Configuration of Optical Head 10B When the optical head 10A2 adopts a top emission structure, it is possible to overlap both the driving transistor Tdr and the control transistor Tc with the light-emitting element E. However, this is allowed, even though the bottom emission structure is adopted. An optical head 10B that is an example of the bottom emission structure is shown in FIGS. 13 and 14. FIG. 13 is a block diagram showing the electrical configuration of the optical head 10B, and FIG. 14 is a sectional view of a light-emitting circuit block 50 of the optical head 10B corresponding to that of the FIG. 5 in the optical head 10A1. In these drawings, portions common to those in FIGS. 2 and 5 are denoted by the same reference numerals.

As shown in FIG. 13, the electrical configuration of the optical head 10B differs from the electrical configuration of the optical head 10A in terms of only the configuration of the unit circuits U1 to Un in the light-emitting circuit block 50. In each of the unit circuits U1 to Un of the optical head 10B, the light-emitting element E1 and the p-channel-type driving transistor Tdr are interposed in series in a path from the feed line L3 (power supply-potential Vel) to the grounding line L4 (grounding potential Gnd). The source of the driving transistor Tdr is connected to the cathode of the light-emitting element E1, and the drain thereof is connected to the grounding line L4. The driving transistor Tdr outputs a current according to the voltage Vgs between the source and gate thereof from the drain thereof. Accordingly, the driving current lei which flows through the light-emitting element E1 becomes a current according to the voltage Vgs between the source and gate of the driving transistor Tdr. Therefore, the driving transistor Tdr functions as means for generating the driving current Ie1 according to the voltage Vgs between the source and gate thereof. The correction potential Va is supplied to the gate of the driving transistor Tdr from a corresponding D-A converter 33. For example, the correction potential Vai is supplied to the gate of the driving transistor Tdr of the unit circuit Ui from the corresponding D-A converter 33.

In the above path, a p-channel-type control transistor Tc is connected in parallel with the light-emitting element E. The drain of the control transistor Tc is connected to the feed line L3, and the source thereof is connected to the cathode of the light-emitting element E1. The gray-scale data D is supplied to the gate of the control transistor Tc from a corresponding latch 42. For example, the gray-scale data Di is supplied to the gate of the control transistor Tc of the unit circuit Ui, whereby the potential thereof becomes the potential of the gray-scale data Di. Accordingly, the control transistor Tc is turned on/off according to the corresponding gray-scale data D.

Further, the control transistor Tc is designed such that the impedance thereof in an ON state becomes sufficiently low compared with the light-emitting element E, that is, most of a current from the feed line L3 passes through the control transistor Tc. Accordingly, the luminance of the light-emitting element E1 in a case where the control transistor Tc is turned on becomes low sufficiently. In this case, the same latent image as that in a case where the light-emitting element E1 does not emit light is obtained. Therefore, the control transistor Tc functions as means for controlling emission of light of the light-emitting element E1 according to the gray-scale data D to be supplied to the gate thereof. Further, the control transistor Tc is also means which becomes a detour for a current from the feed line L3, and keeps the power consumption of the unit circuit Ui from depending on the gray-scale data D.

A-9: Structure of Optical Head 10B

The orientation of the sectional view of FIG. 14 is the same as the orientation of the sectional view of FIG. 5. However, in FIG. 14, the light-emitting element E1 is located below the substrate 12. In the light-emitting element E1, the anode Ep1 is located above the light-emitting portion Ee and the cathode En1 is located below the light-emitting portion Ee. This is because a substrate 67 in which the driving transistor Tdr and the control transistor Tc are formed exists separately from the substrate 12 in which the light-emitting element E1 is formed. That is, the optical head 10B adopts a structure in which the substrate 12 in which the light-emitting element E1 is formed, and the substrate 67 in which the driving transistor Tdr and the control transistor Tc are formed are bonded together with an adhesion layer 651.

In the optical head 10B, the driving transistor Tdr and the control transistor Tc are formed on the substrate 67. The source electrode ST of the driving transistor Tdr is a portion of the feed line L4, and the source electrode ST of the control transistor Tc is a portion of the grounding line L3. In each unit circuit U, the drain electrode DT of the driving transistor Tdr also serves as the drain electrode DT of the control transistor Tc. The driving transistor Tdr and the control transistor Tc are covered with an insulating layer 62, and wiring lines 68 are formed in every unit region UR on the insulating layer 62. The wire line 68 is electrically connected to the drain electrode DT common to the driving transistor Tar and the control transistor Tc through a contact Cnt.

On the other hand, the light-emitting element E1 is formed below the substrate 12, and the common cathode En1 thereof, except for a portion thereof, is covered with the same passivation layer PL as the passivation layer 651 of FIG. 5. The portion which is not covered with the passivation layer PL exists in every unit region UR. These portions are electrically connected to the wiring lines 68 through a conductive material M formed from a material, such as metal. The adhesion layer 62 is formed so as to bury a space surrounded by the passivation layer PL, the common cathode En1, the insulating layer 62, and the wiring lines 68 without hindering the electrical connection. In addition, the substrate 12, the passivation layer PL, the adhesion layer 651, and the insulating layer 62 may be formed from a light-blocking material.

A-10: Effects of Optical Head 10B

As apparent from the above description, the light-emitting element E1 is formed on the optically transparent first substrate 12, the driving transistor Tdr and the control transistor Tc are formed on the second substrate 67, and the light-emitting element E1, the driving transistor Tdr, and the control transistor Tc are arranged between the substrate E1 and the substrate 67. Therefore, according to the optical head 10B, the light from the light-emitting element E1 is transmitted through and emitted from the substrate 12 without being blocked by the driving transistor Tdr or the control transistor Tc. That is, it is possible to use the bottom-emission-type light-emitting device. Further, according to the optical head 10B, the same effects as those obtained by the optical head 10A2 can be obtained.

B: Image Forming Apparatus

Next, with reference to FIG. 15, an aspect of the image forming apparatus according to the invention will be described. This image forming apparatus is a tandem full-color image forming apparatus using a belt as an intermediate transfer body.

In this image forming apparatus, four optical heads 10K, 10C, 10M, and 10Y having the same configuration are arranged in positions where they face image formation surfaces 110A of four corresponding photosensitive drums (image carriers) 110K, 110C, 110M, and 110Y having the same configuration. The optical heads 10K, 10C, 10M, and 10Y have the same configuration as the optical unit 10 according to each of the aforementioned embodiments.

Figure 15:
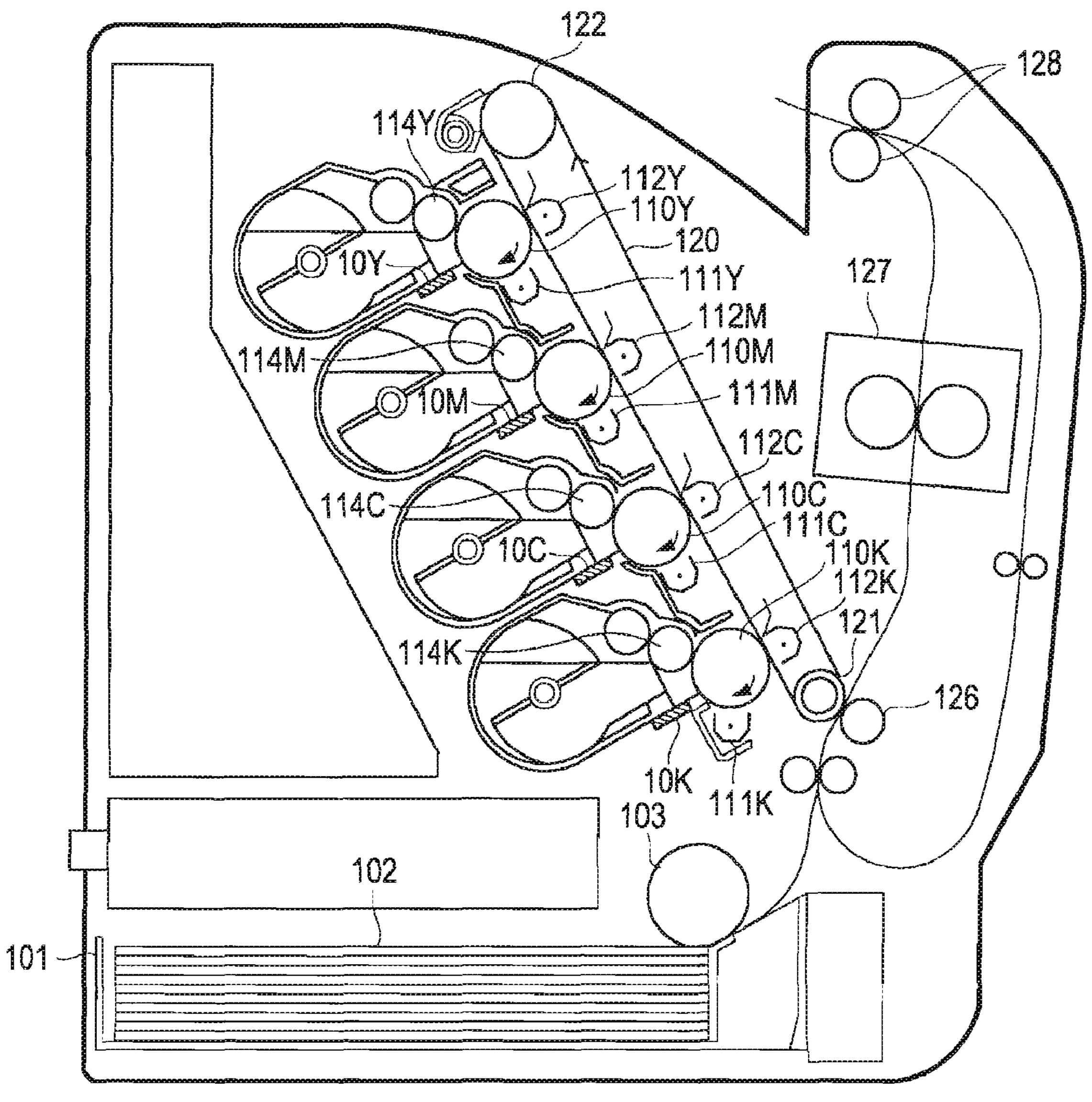
FIG. 15 is a longitudinal sectional view showing the configuration of an image forming apparatus according to the invention.

As shown in FIG. 15, the image forming apparatus is provided with a driving roller 121, a driven roller 122, and an endless intermediate transfer belt 120 is wound around these rollers 121 and 122, and is rotated around the rollers 121 and 122 in a direction indicated by an arrow. Although not shown, tension-applying means, such as a tension roller, which applies a tension to the intermediate transfer belt 120, may be provided.

The four photosensitive drums 110K, 110C, 110M, and 110Y having a photosensitive layer on an outer peripheral surface thereof are arranged with a predetermined gap therebetween around the intermediate transfer belt 120. Suffixes "K", "C", "M", and "Y" mean that the drums are used to form images developed in black, cyan, magenta, and yellow, respectively. This is similarly applied to other members. The photosensitive drums 110K, 110C, 110M, and 110Y are rotationally driven in synchronization with driving of the intermediate transfer belt 120.

A corona charger 111 (K, C, M, or Y), the optical head 10 (K, C, M, or Y), and a developing device 114 (K, C, M, or Y) are arranged around each photoconductive drum 110 (K, C, M, or Y). The corona charger 111 (K, C, M, or Y) uniformly charges the image formation surface 110A (outer peripheral surface) of the photoconductive drum 110 (K, C, M, or Y) corresponding thereto. The optical head 10 (K, C, M, or Y) writes an electrostatic latent image in the charged image formation surface 110A of each photoconductive drum. In each optical head 10 (K, C, M, or Y), a plurality of light-emitting elements E are arrayed along a generatrix (main scanning direction) of the photoconductive drum 110 (K, C, M, or Y). The writing of an electrostatic latent image is performed by irradiating the photoconductive drum 110 (K, C, M, or Y) with light by the plurality of light-emitting elements E. The developing device 114 (K, C, M, or Y) causes toner as developer to adhere to the electrostatic latent image, thereby forming a developed image (i.e., visible image) on the photoconductive drum 110 (K, C, M, or Y).

The four developed images in black, cyan, magenta, and yellow formed by such four single-color developed image forming stations are primarily transferred sequentially onto the intermediate transfer belt 120, and are superimposed on the intermediate transfer belt 120, consequently forming a full-color developed image. Four primary transfer corotrons (transfer devices) 112 (K, C, M, and Y) are arranged inside the intermediate transfer belt 120. Each of the primary transfer corotrons 112 (K, C, M, or Y) is arranged in the vicinity of the photoconductive drum 110 (K, C, M, or Y), and electrostatically attracts a developed image from the photoconductive drum 110 (K, C, M, or Y) to transfer the developed image to the intermediate transfer belt 120 which passes between the photoconductive drum and the primary transfer corotron.

A sheet 102 as an object (recording material) which forms an image finally is fed one by one from a sheet feeding cassette 101 by a pickup roller 103, and then sent to a nip between the intermediate transfer belt 120 and a secondary transfer roller 126 which touch the driving roller 121. A full-color developed image on the intermediate transfer belt 120 is secondarily and collectively transferred onto one side of the sheet 102 by the secondary transfer roller 126, and is fixed on the sheet 102 while it passes between a pair of fixing rollers 127 as a fixing section. Thereafter, the sheet 102 is discharged onto a sheet discharge cassette formed in an upper portion of the apparatus by a pair of sheet discharge rollers 128.

Figure 16:
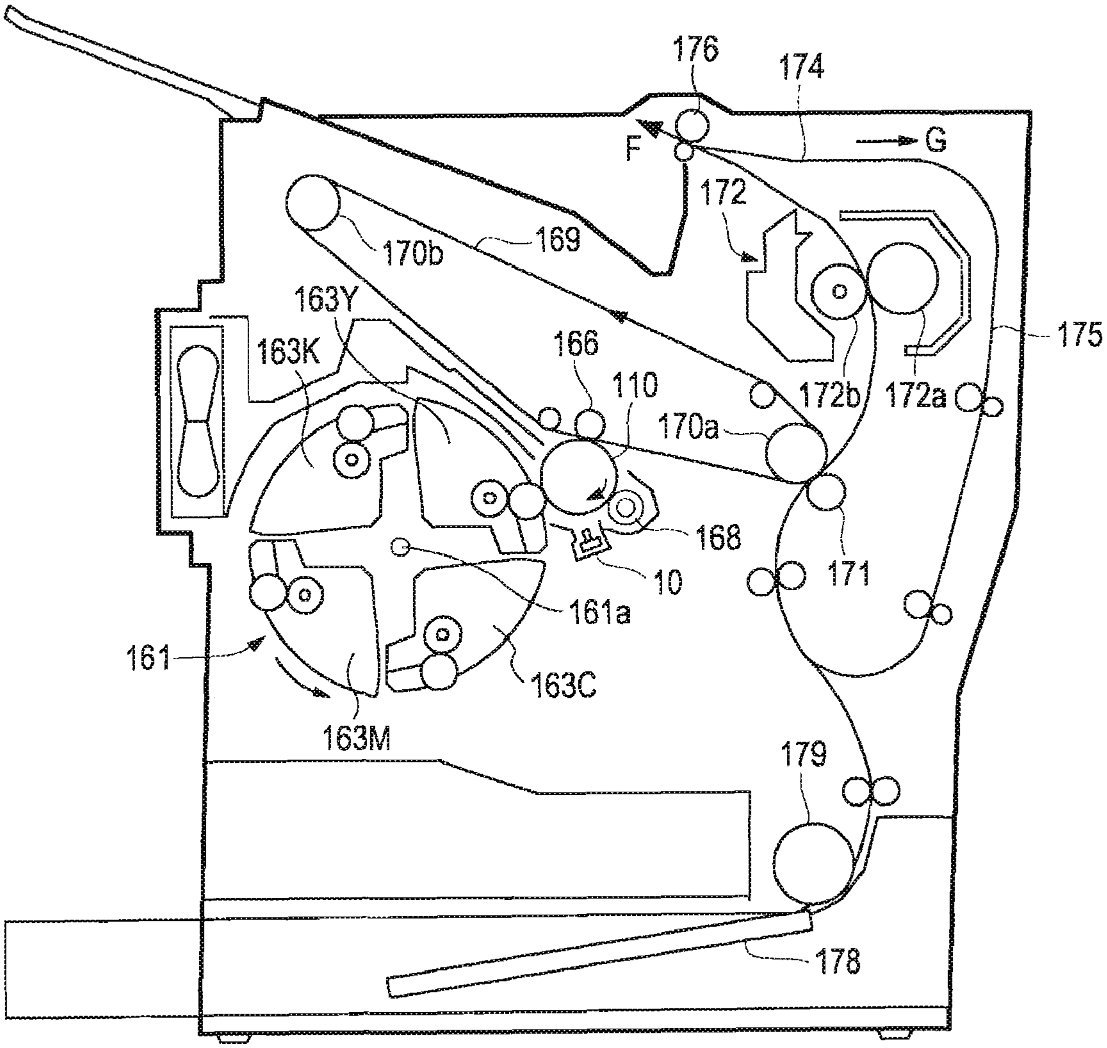
FIG. 16 is a longitudinal sectional view showing the configuration of another image forming apparatus according to the invention.

Next, with reference to FIG. 16, another aspect of the image forming apparatus according to the invention will be described. This image forming apparatus is a rotary-development-type full-color image forming apparatus using a belt as an intermediate transfer body. As shown in FIG. 16, a corona charger 168, a rotary developing unit 161, the optical head 10 according to the above embodiment, and an intermediate transfer belt 169 are provided around the photoconductive drum 110.

The corona charger 168 uniformly charges the outer peripheral surface of the photoconductive drum 110. The optical head 10 writes an electrostatic latent image in the charged image formation surface (outer peripheral surface) 110A of the photoconductive drum 110. In the optical head 10, a plurality of light-emitting elements E are arrayed along a generatrix (main scanning direction) of the photoconductive drum 110. The writing of an electrostatic latent image is performed by irradiating the photoconductive drum 110 with light from these light-emitting elements E, The developing unit 161 is a unit in which four developing devices 163Y, 163C, 163M, and 163K are arranged at intervals of 90°, and is rotatable counterclockwise about an axis 161*a*. The developing devices 163Y, 163C, 163M, and 163K supply yellow, cyan, magenta, and black toners to the photoconductive drum 110, respectively, and causes toners as developers to adhere to the electrostatic latent image, thereby forming a developed image (i.e., visible image) on the photoconductive drum 110.

An endless intermediate transfer belt 169 is wound around a driving roller 170*a*, a driven roller 170*b*, a primary transfer roller 166, and a tension roller, and is rotated in a direction indicated by an arrow around these rollers. The primary transfer roller 166 electrostatically attracts a developed image from the photoconductive drum 110 to transfer the developed image to the intermediate transfer belt 169 which passes between the photoconductive drum 110 and the primary transfer roller 169.

Specifically, with first one rotation of the photoconductive drum 110, an electrostatic latent image for a yellow (Y) image is written by the optical head 10, and a developed image of the same color is formed by the developing device 163Y, and further transferred to the intermediate transfer belt 169. Further, with the next one rotation an electrostatic latent image for a cyan (C) image is written, and a developed image of the same color is formed by the developing device 163C, and transferred to the intermediate transfer belt 169 so that it may be superimposed on the yellow developed image. Then, while the photoconductive drum 110 makes four rotations in this way, the yellow, cyan, magenta, and black developed images are sequentially superimposed on the intermediate transfer belt 169, and consequently a full-color developed image is formed on the transfer belt 169. In a case where an image is formed on both sides of a sheet as an object on which an image, is formed, finally, a full-color developed image is formed on the intermediate transfer belt 169 in such a manner that a developed image of the same color for a front side and a back side of the sheet is transferred to the intermediate transfer belt 169, and then, a developed image of the next color for the front side and the back side of the sheet is transferred to the intermediate transfer belt 169.

The image forming apparatus is provided with a sheet transporting path 174 through which sheets pass. A sheet is taken out one by one from a sheet feeding cassette 178 by a pickup roller 179, is advanced in the sheet conveying path 174 by a transportation roller, and passes through a nip between the intermediate transfer belt 169 and a secondary transfer roller 171 which touch a driving roller 170*a*. The secondary transfer roller 171 electrostatically attracts a full-color developed image collectively from the intermediate transfer belt 169 to transfer the developed image to one side of the sheet. The secondary transfer roller 171 is adapted to be brought close to or separated from the intermediate transfer belt 169 by a clutch (not shown). Also, when a full-color developed image is transferred to a sheet, the secondary transfer roller 171 is brought into abutment with the intermediate transfer belt 169, and while developed images are superimposed on the intermediate transfer belt 169, the secondary transfer roller 171 is separated from the intermediate transfer belt.

The sheet on which the image has been transferred as mentioned above is transported to a fixing unit 172, and the developed image on the sheet is fixed while it passes between a heating roller 172*a* and a pressing roller 172*b* of the fixing unit 172. The sheet after the fixing treatment is pulled in between a pair of sheet discharge rollers 176 and advances in a direction indicated by an arrow F. In the case of double-side printing, after most of the sheet passes through the pair of sheet discharge rollers 176, the pair of sheet discharge rollers 176 are rotated in a reverse direction to introduce the sheet into a transporting path 175 for double-side printing as indicated by an arrow G. Then, after the developed image is transferred to the other side of the sheet by the secondary transfer roller 171, and is subjected to fixing treatment again by the fixing unit 172, the sheet is discharged by the pair of sheet discharge rollers 176.

Since the image forming apparatus shown in FIGS. 15 and 16 uses a light source (exposure means) which adopts OLED elements as the light-emitting elements E, the apparatus is made smaller than a case where a laser scanning optical system is used. Further, since the luminance, of each light-emitting element E when being turned on becomes approximately constant, the unevenness of the gray-scale in an image to be formed can be reduced. In addition, the electro-optical device of the invention can also be employed in an electrophotographic image forming apparatus other than the apparatuses illustrated above. For example, the electro-optical device according to the invention can also be applied to an image forming apparatus of a type in which a developed image is transferred directly to a sheet from a photoconductive drum without using an intermediate transfer belt, and an image forming apparatus which forms a monochromatic image.

The entire disclosure of Japanese Patent Application No. 2006-026593, filed Feb. 3, 2006 is expressly incorporated by reference herein.

What is claimed is:

1. An optical head comprising a plurality of unit regions repeatedly arrayed in one direction, each region being constituted by a light-emitting element which is driven by a current to emit light, a control transistor which is connected in parallel with the light-emitting element, and which receives gray-scale data that specifies a high gray-scale level for the light-emitting element so as to be turned off and which receives gray-scale data that specifies a low gray-scale level for the light-emitting element so as to be turned on, and a driving transistor which is connected in series with the light-emitting element to generate a current, wherein, in each of the plurality of unit regions, a thermal resistance between the light-emitting element formed in the unit region and the control transistor formed in the unit region is smaller than a thermal resistance between the light-emitting element and a control transistor formed in a unit region adjacent to the unit region, wherein the optical head is composed of a plurality of layers, the light-emitting element has a laminated light-emitting portion which emits light by flow of a current therethrough, the light-emitting element does not overlap both the control transistor and the driving transistor as viewed from a direction vertical to the light-emitting portion in each of the plurality of unit regions, and the control transistor and the driving transistor are formed on opposite sides of the light-emitting element as viewed from the direction vertical to the light-emitting portion in each of the plurality of unit regions.

2. The optical head according to claim 1, wherein the optical head is composed of a plurality of layers, the light-emitting element has a laminated light-emitting portion which emits light by flow of a current therethrough, and the light-emitting element overlaps the control transistor as viewed from a direction vertical to the light-emitting portion in each of the plurality of unit regions.

3. The optical head according to claim 2, wherein the light-emitting element is formed on an optically transparent first substrate, the driving transistor and the control transistor are formed on a second substrate, and the light-emitting element, the driving transistor, and the control transistor are arranged between the first substrate and the second substrate.

4. An image forming apparatus comprising:

the optical head according to claim 1, and an image carrier, wherein the image carrier is charged, the charged surface of the image carrier is irradiated with light from the optical head to form a latent image, and toner is caused to adhere to the latent image to form a developed image, and the developed image is transferred to an object.

5. The optical head according to claim 1 wherein the drain electrode of the control transistor is also a drain electrode of the driving transistor.

6. The optical head according to claim 5, wherein the drain electrode is formed along a perimeter of the light-emitting element such that the control transistor and the driving transistor are electrically connected.

* * * * *